(12) United States Patent
Kakuda et al.

(10) Patent No.: US 12,101,426 B1
(45) Date of Patent: Sep. 24, 2024

(54) ELECTRONIC DEVICES HAVING VERTICAL IMAGE TRANSPORT LAYERS

(71) Applicant: Apple Inc., Cupertino, CA (US)

(72) Inventors: Tyler R. Kakuda, San Francisco, CA (US); Hao Dong, San Jose, CA (US); Ian T. Clark, San Jose, CA (US); Jean-Pierre S. Guillou, Los Gatos, CA (US); Michael J. Brown, Campbell, CA (US); Paul C. Kelley, San Francisco, CA (US); Shaorui Yang, San Jose, CA (US); Warren S. Rieutort-Louis, Cupertino, CA (US); Yi Qiao, San Jose, CA (US); Ying-Chih Wang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/526,869

(22) Filed: Nov. 15, 2021

Related U.S. Application Data

(63) Continuation of application No. 16/566,753, filed on Sep. 10, 2019, now abandoned.

(60) Provisional application No. 62/760,494, filed on Nov. 13, 2018.

(51) Int. Cl.
| | | |
|---|---|---|
| *H04M 1/02* | (2006.01) |
| *G02B 6/06* | (2006.01) |
| *H10K 50/84* | (2023.01) |
| *H10K 50/858* | (2023.01) |
| *H10K 77/10* | (2023.01) |
| *H10K 102/00* | (2023.01) |

(52) U.S. Cl.
CPC ............ *H04M 1/0269* (2022.02); *G02B 6/06* (2013.01); *H10K 50/841* (2023.02); *H10K 50/858* (2023.02); *H10K 77/111* (2023.02); *H10K 2102/311* (2023.02)

(58) Field of Classification Search
CPC .... H04M 1/0268; G02B 6/06; H01L 51/0097; H01L 51/524; H01L 51/5275; H01L 2251/5338
USPC .......................................................... 455/566
See application file for complete search history.

(56) References Cited

U.S. PATENT DOCUMENTS

| | | |
|---|---|---|
| 4,349,817 A | 9/1982 | Hoffman et al. |
| 4,534,813 A | 8/1985 | Williamson et al. |
| 5,329,386 A | 7/1994 | Birecki et al. |

(Continued)

FOREIGN PATENT DOCUMENTS

KR 20180034832 A 4/2018

*Primary Examiner* — April G Gonzales
(74) *Attorney, Agent, or Firm* — Treyz Law Group, P.C.; Tianyi He

(57) ABSTRACT

An electronic device may have pixels that form an active area for a flexible display layer. An inactive area that is free of pixels may surround the active area. One or more edges of the flexible display layer may be bent around respective bend axes. The display layer may also have one or more unbent edges in which the inactive area and active area of the display have a planar shape. An image transport layer may have an input surface that receives the image and an output surface to which the image is transported. The image transport layer may be formed from a coherent fiber bundle or a layer of Anderson localization material. The coherent fiber bundle may have straight fibers that run parallel to each other in a vertical direction that is parallel to a surface normal of a central portion of the display layer.

39 Claims, 17 Drawing Sheets

(56) References Cited

U.S. PATENT DOCUMENTS

| | | | |
|---|---|---|---|
| 5,502,457 A | 3/1996 | Sakai et al. | |
| 5,659,378 A | 8/1997 | Gessel | |
| 6,046,730 A | 4/2000 | Bowen et al. | |
| 6,407,785 B1 | 6/2002 | Yamazaki | |
| 6,467,922 B1 | 10/2002 | Blanc et al. | |
| 6,680,761 B1 | 1/2004 | Greene et al. | |
| 6,845,190 B1 | 1/2005 | Smithwick et al. | |
| 7,228,051 B2 | 6/2007 | Cok et al. | |
| 7,542,209 B2 | 6/2009 | McGuire, Jr. | |
| 7,823,309 B2 | 11/2010 | Albenda | |
| 7,856,161 B2 | 12/2010 | Tabor | |
| 8,045,270 B2 | 10/2011 | Shin et al. | |
| 8,723,824 B2 | 5/2014 | Myers et al. | |
| 8,824,779 B1 | 9/2014 | Smyth | |
| 8,976,324 B2 | 3/2015 | Yang et al. | |
| 9,268,068 B2 | 2/2016 | Lee | |
| 9,312,517 B2 | 4/2016 | Drzaic et al. | |
| 9,342,105 B2 | 5/2016 | Choi et al. | |
| 9,501,174 B2 * | 11/2016 | Doyle | G06F 3/0418 |
| 9,509,939 B2 | 11/2016 | Henion et al. | |
| 9,591,765 B2 | 3/2017 | Kim et al. | |
| 9,755,004 B2 | 9/2017 | Shieh et al. | |
| 9,759,937 B2 * | 9/2017 | Reightler | G02B 6/0088 |
| 9,811,711 B2 * | 11/2017 | Huang | G06V 40/1365 |
| 9,818,725 B2 | 11/2017 | Bower et al. | |
| 9,907,193 B2 * | 2/2018 | Lee | H05K 5/03 |
| 9,939,672 B2 * | 4/2018 | Kakuda | G02F 1/133385 |
| 10,048,532 B2 | 8/2018 | Powell et al. | |
| 10,052,831 B2 | 8/2018 | Welker et al. | |
| 10,153,457 B2 * | 12/2018 | Son | H10K 77/111 |
| 10,156,874 B2 * | 12/2018 | Hooton | G06F 1/1626 |
| 10,242,975 B2 * | 3/2019 | Kim | H10K 77/111 |
| 10,638,619 B2 * | 4/2020 | Seo | H05K 5/0017 |
| 10,877,570 B1 | 12/2020 | Wilson | H01H 13/83 |
| 10,983,256 B2 * | 4/2021 | Huang | G02B 6/08 |
| 11,309,370 B1 * | 4/2022 | Brown | H05K 1/118 |
| 11,388,329 B1 * | 7/2022 | Qiao | G02B 6/08 |
| 11,436,964 B1 * | 9/2022 | Wang | G09G 3/20 |
| 2006/0016448 A1 | 1/2006 | Ho | |
| 2007/0097108 A1 | 5/2007 | Brewer | |
| 2008/0144174 A1 | 6/2008 | Lucente et al. | |
| 2008/0186252 A1 | 8/2008 | Li | |
| 2010/0177261 A1 | 7/2010 | Jin et al. | |
| 2010/0238090 A1 | 9/2010 | Pomerantz et al. | |
| 2011/0025594 A1 | 2/2011 | Watanabe | |
| 2011/0057861 A1 | 3/2011 | Cok et al. | |
| 2011/0102300 A1 | 5/2011 | Wood et al. | |
| 2011/0242686 A1 * | 10/2011 | Watanabe | G02B 17/0884 359/804 |
| 2012/0218219 A1 * | 8/2012 | Rappoport | H10K 59/131 345/174 |
| 2013/0081756 A1 * | 4/2013 | Franklin | G06F 1/16 264/479 |
| 2013/0083080 A1 | 4/2013 | Rappoport et al. | |
| 2013/0235560 A1 | 9/2013 | Etienne et al. | |
| 2013/0279088 A1 * | 10/2013 | Raff | G06F 1/1601 361/679.01 |
| 2014/0037257 A1 * | 2/2014 | Yang | G02B 6/08 385/116 |
| 2014/0092028 A1 * | 4/2014 | Prest | G02F 1/13336 345/55 |
| 2014/0092346 A1 * | 4/2014 | Yang | H10K 50/858 349/84 |
| 2014/0183473 A1 * | 7/2014 | Lee | H10K 59/12 257/40 |
| 2014/0240985 A1 * | 8/2014 | Kim | H05K 1/028 438/34 |
| 2014/0328041 A1 * | 11/2014 | Rothkopf | H05K 5/0217 361/807 |
| 2014/0354920 A1 * | 12/2014 | Jang | G02F 1/13336 445/24 |
| 2014/0370244 A1 * | 12/2014 | Kinoshita | H05K 5/0017 428/177 |
| 2015/0093087 A1 * | 4/2015 | Wu | G02B 6/10 385/132 |
| 2015/0227227 A1 * | 8/2015 | Myers | G06F 3/04886 345/173 |
| 2016/0196778 A1 * | 7/2016 | Cha | G09G 3/03 345/694 |
| 2016/0231784 A1 * | 8/2016 | Yu | G02F 1/133305 |
| 2016/0234362 A1 * | 8/2016 | Moon | H04B 1/385 |
| 2016/0238785 A1 * | 8/2016 | Park | G02B 6/0068 |
| 2017/0235341 A1 * | 8/2017 | Huitema | G04G 17/08 361/679.03 |
| 2018/0033980 A1 * | 2/2018 | Park | H10K 50/844 |
| 2018/0052312 A1 | 2/2018 | Jia et al. | |
| 2018/0088416 A1 | 3/2018 | Jiang et al. | |
| 2018/0128973 A1 * | 5/2018 | Powell | H10K 50/858 |
| 2018/0183913 A1 * | 6/2018 | Kwak | G06F 1/1698 |
| 2018/0372958 A1 | 12/2018 | Karafin et al. | |

* cited by examiner

ELECTRONIC DEVICES HAVING VERTICAL IMAGE TRANSPORT LAYERS

This application is a continuation of U.S. patent application Ser. No. 16/566,753, filed Sep. 10, 2019, which claims the benefit of provisional patent application Ser. No. 62/760,494, filed Nov. 13, 2018, which are hereby incorporated by reference herein in their entireties

FIELD

This relates generally to electronic devices, and, more particularly, to electronic devices with image transport layers.

BACKGROUND

Electronic devices such as cellular telephones, tablet computers, and other electronic equipment may include housing structures. Electrical components such as displays and sensors may be mounted within the housing structures.

If care is not taken, an electronic device may not have a desired appearance or may be difficult to use satisfactorily. For example, housing structures may not have a desired shape and may not accommodate desired electrical components.

SUMMARY

An electronic device may have a display with an array of pixels. The pixels may form an active area for a flexible display layer. An inactive area that is free of pixels may surround the active area. One or more edges of the flexible display layer may be bent around respective bend axes. The display layer may also have one or more unbent edges where the inactive area and active area of the display have a planar shape.

An image transport layer may have an input surface that receives an image produced by the array of pixels and an output surface to which the image is transported through the image transport layer. The image transport layer may be formed from a coherent fiber bundle or a layer of Anderson localization material. The coherent fiber bundle may have straight fibers that run parallel to each other in a vertical direction that is parallel to a surface normal of a central portion of the display layer.

The periphery of the electronic device may have upper and lower opposing edges and left and right opposing edges. The electronic device may, for example, be a cellular telephone in which the left and right edges are longer than the upper and lower edges when the cellular telephone is used in a normal portrait mode orientation.

In an illustrative configuration, active area portions of the display layer along the right and left edges are bent about respective left and right bend axes whereas only the inactive area of the display is bent along the lower edge. In this arrangement, the upper edge of the display layer may be unbent. A planar inactive area portion of the display layer along the upper edge may be interposed between a display cover layer and a housing wall or other housing structures.

In another illustrative configuration, active portions of the display layer along only the upper and lower edges are bent whereas the portions of the display layer running along the left and right edges are unbent. An inactive tail portion of the display layer along the lower edge may be bent and coupled to circuitry on a printed circuit in an interior region of the electronic device.

If desired, a flexible display may have a portion that wraps around the upper edge of an electronic device or other edge portion of the electronic device. This wrapped display arrangement may be used to display images on a rear face of the electronic device. An image transport layer may be interposed between a front portion of the flexible display and an associated display cover layer.

DETAILED DESCRIPTION

Electronic devices may be provided with displays and other visual output devices. For example, an electronic device may have a display with an array of pixels that displays an image. To help enhance device aesthetics and/or to help enhance performance, the electronic device may include structures that transport the image or other visual output from an input surface to an output surface through coherent fiber bundle or a layer of Anderson localization material. Structures such as these may sometimes be referred to as image transport layers, image transport structures, image transport layer structures, etc.

As an example, an electronic device may have a display on which an image is displayed. An image transport layer may overlap the display so that an input surface of the image transport layer is adjacent to the display and receives the image from the display. The image transport layer may transport the image from the input surface to a corresponding output surface of the image transport layer. The output surface faces outwardly from the electronic device, so that the image on the output surface may be viewed by a user of the electronic device. If desired, the output surface may have a curved cross-sectional profile and one or more areas of compound curvature.

The image transport layer structures in the electronic device may be configured to accommodate curved surfaces, to hide display seams, to hide hinges or other mechanical structures, to reduce display border widths, to distribute an image or other visual output over multiple surfaces of the device, or to otherwise provide the electronic device with a desired shape and ability to supply a user with visual output.

Figure 1:
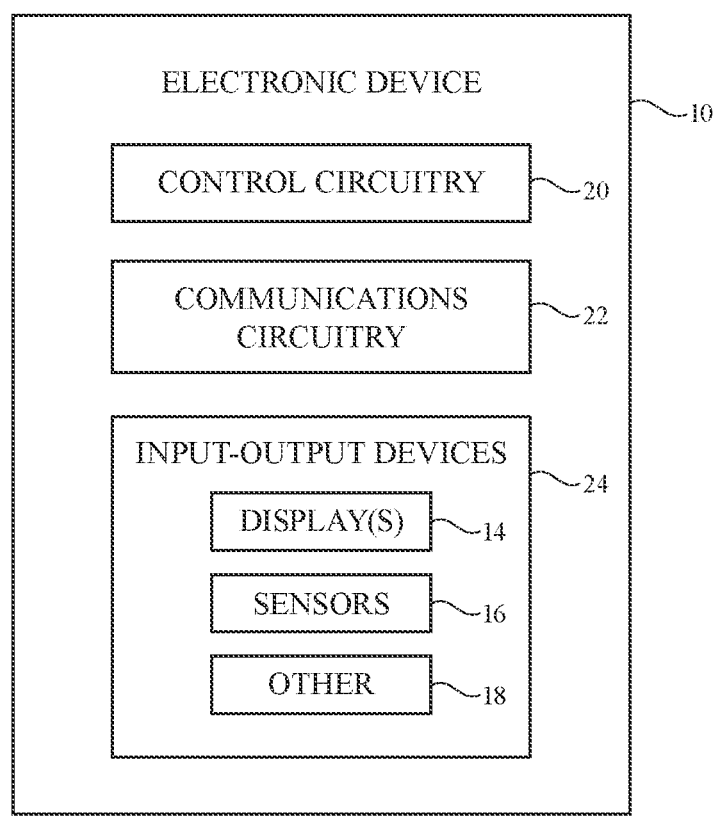
FIG. 1 is a schematic diagram of an illustrative electronic device in accordance with an embodiment.

A schematic diagram of an illustrative electronic device having an image transport layer is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display(s) 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on one or more substrates such as one or more flexible substrates (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
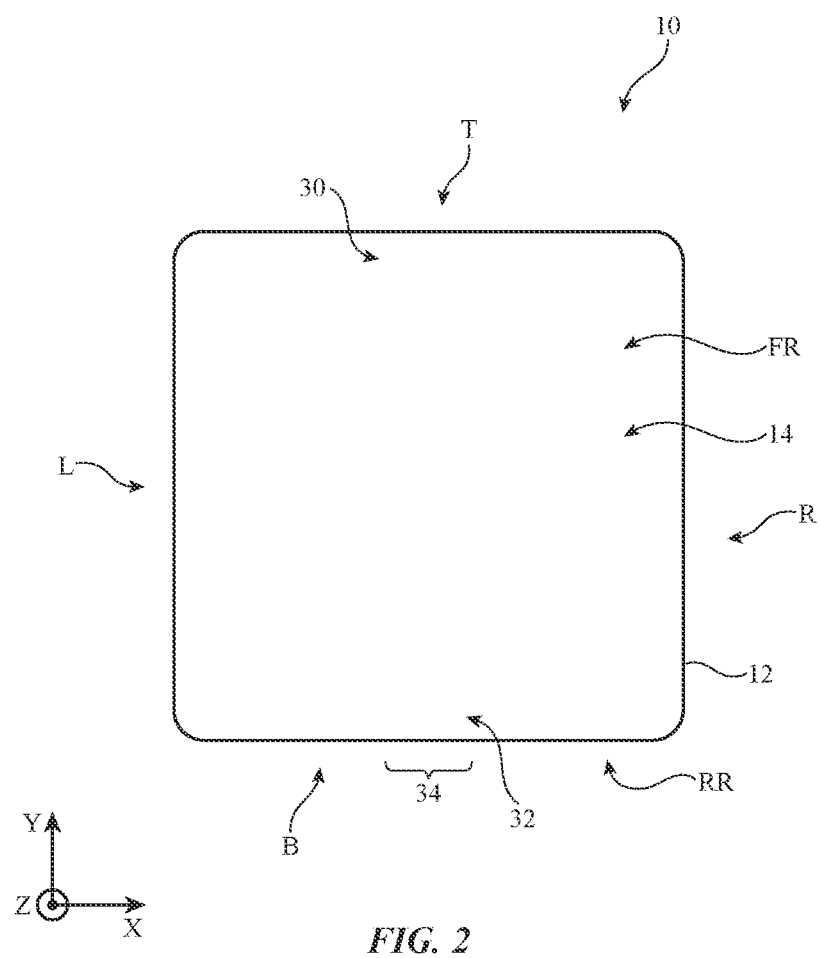
FIG. 2 is a top view of an illustrative electronic device in accordance with an embodiment.

FIG. 2 is a front (plan) view of electronic device 10 in an illustrative configuration in which display 14 covers some or all of the front face FR of device 10. Opposing rear face RR of device 10 may be covered by a housing wall formed from glass, metal, polymer, and/or other materials. Rear face RR may be free of display pixels and/or may be partly or fully covered by display 14.

Device 10 may include a housing (e.g., housing 12) that forms sidewall structures for device 10 and/or internal supporting structures (e.g., a frame, midplate member, etc.). Glass structures, transparent polymer structures, image transport layer structures, and/or other transparent structures that cover display 14 and other portions of device 10 may provide structural support for device 10 and may sometimes be referred to as housing structures. For example, a transparent housing portion such as a glass or polymer layer housing structure that covers and protects a pixel array in display 14 may serve as a display cover layer for the pixel array while also serving as a front housing wall.

In some illustrative arrangements, sidewall portions of device 10 and/or portions of the rear of device 10 may be covered with portions of display 14. In the example of FIG. 2, device 10 is characterized by four peripheral edges: upper edge T, lower edge B, left edge L, and right edge R. Upper edge T and opposing lower edge B may run parallel to each other and parallel to the X axis of FIG. 2. Left edge L and opposing right edge R may run parallel to each other and parallel to the Y axis of FIG. 2. Front face FR and rear face RR may be planar (e.g., two parallel planes offset by a distance along the Z axis) and/or may include curved portions.

Touch sensor circuitry such as two-dimensional capacitive touch sensor circuitry may be incorporated into one or more displays in device 10 as separate touch sensor panels overlapping display pixels or as part of one or more display panels in device 10. Touch sensors may be formed on front face FR, rear face RR, and/or edges (sidewall faces) T, B, R, and/or L. If desired, icons and other images for virtual buttons may be displayed by the pixels of device. For example, virtual buttons and/or other images may be displayed on front face FR, rear face RR, and/or edges T, B, R, and/or L and may overlap touch sensor circuitry. Haptic output devices may be used to provide haptic feedback when virtual buttons are selected (as an example).

Device 10 of FIG. 2 has a rectangular outline (rectangular periphery) with four rounded corners. In some configurations, left edge L and opposing right edge R may be longer than upper edge T and lower edge B (e.g., the outline of device 10 and display 14 when viewed straight on from the front may be a portrait-mode rectangular shape suitable for when device 10 is held in a user's hand for normal cellular telephone use and viewing). If desired, device 10 may have other shapes. For example, device 10 may have a shape that folds and unfolds along a bend (folding) axis and may include a display that overlaps or that does not overlap the bend axis, may have a shape with an oval footprint or circular outline, may have a cubic shape, may have a pyramidal, cylindrical, spherical, or conical shape, or may have other suitable shapes. The configuration of FIG. 2 is illustrative.

If desired, openings may be formed in the surfaces of device 10. For example, a speaker port and optical windows for an ambient light sensor, an infrared proximity sensor, and a depth sensor may be formed in a region such as upper region 30 of front face FR. A fingerprint sensor, touch sensor button, force-sensitive button, or other sensor that operates through display 14 may be formed under the portion of display in lower region 32 on front face FR and/or other portions of front face FR and/or other external surfaces of device 10. Device 10 may be free of connector openings or an opening for a connector (e.g., a digital data connector, analog signal connector, and/or power connector) may be formed in portion 34 of the lower sidewall of device 10 running along lower edge B or elsewhere in device 10. Openings such as connector openings may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

Figure 3:
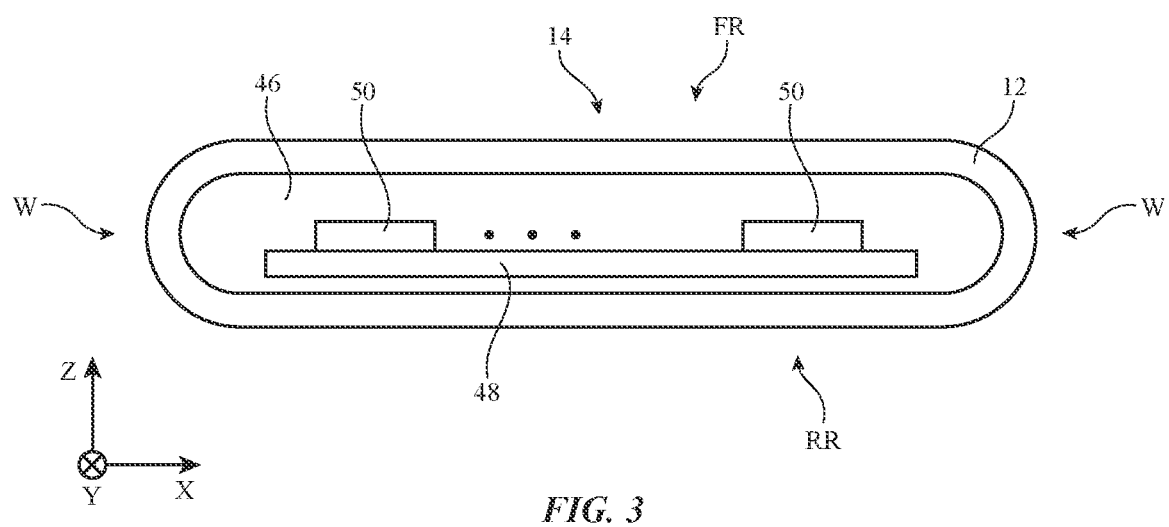
FIG. 3 is a cross-sectional side view of an illustrative electronic device in accordance with an embodiment.

FIG. 3 is a cross-sectional side view of an illustrative electronic device. As shown in FIG. 3, device 10 may have a housing such as housing 12. Housing 12 may include structures formed from glass, polymer, metal, wood, sapphire or other crystalline material, ceramic, fabric, other materials, and/or combinations of these materials. In some configurations, transparent portions of housing 12 may be configured to form display cover layers that overlap one or more displays or other light-emitting optical components. In the example of FIG. 3, display 14 is formed on front face FR of device 10. Display 14 includes an array of pixels. During operation, the pixels are used to display an image for viewing by a user of device 10. Arrays of pixels for displays in device 10 may sometimes be referred to as pixel layers, pixel array layers, displays, display structures, display layers, or display panels. In general, displays and other optical components may be located on front face FR, rear face RR, and/or sidewalls W of device 10 (e.g., sidewalls on edges T, B, R, and/or L that extend between front face FR and rear face RR). Housing 12 may have planar portions (e.g., there may be planar areas with surface normals that are parallel to the Z axis of FIG. 3 in central portions of front face FR and rear face RR and/or sidewalls W of device 10 may contain one or more planar areas). Housing 12 may also have curved portions (e.g., curved edges, curved corners, portions of front face FR and/or rear face RR that have curved cross-sectional profiles, etc.).

As shown in FIG. 3, device 10 may include electrical components 50 in interior 46 (e.g., components for forming circuitry of the type shown in FIG. 1 such as integrated circuits, sensors and other input-output devices, control circuitry, display layers such as organic light-emitting diode panels or other display layers, etc.). Electrical components 50 may, if desired, be mounted on printed circuits such as printed circuit 48 (e.g., flexible printed circuits and/or printed circuits formed from rigid printed circuit board material).

In some configurations, a display may be formed on rear face RR. In other configurations, no display is present on rear face RR. In configurations in which no display is present on rear face RR, a portion of housing 12 on rear face RR may be formed from opaque materials such as metal (e.g., a stainless steel or aluminum layer). For example, device 10 may have a rear housing wall formed from metal and may have optional meal sidewalls that extend upwardly from the rear housing wall. If desired, device 10 may have a rear housing wall and/or other housing walls formed from other opaque housing structures such as opaque glass, transparent glass coated with opaque materials such as ink or metal, and/or other housing wall materials.

In some configurations for device 10, an opaque material such as metal or opaque polymer may form some or all of sidewalls W of device 10. As an example, metal that forms some or all of a rear housing wall on rear face RR of device 10 may protrude upwardly along the edges of device 10 to form some or all of the sidewalls for device 10. As another example, a peripheral metal band that forms some or all of the sidewalls of device 10 may extend around the rectangular periphery of device 10 (e.g., along upper edge T, right edge R, lower edge B, and left edge L). Sidewalls may have vertically extending planar surfaces and/or may exhibit other surface profiles (e.g., curved profiles).

If desired, some or all of the sidewalls of device 10 may be formed from clear material and may overlap light-producing components. This material may, as an example, be part of a display cover layer (e.g., a sidewall may be formed from an extension of a central display cover layer portion and may be formed from glass, polymer, crystalline material, etc.). Because clear layers of glass, plastic, crystalline material, and/or other clear layers of material in device 10 may enclose and protect internal device components, these outer layers of material in device 10 may serve as portions of housing 12 for device 10.

In configurations for device 10 in which sidewalls have transparent portions formed from extending portions of a display cover layer or other transparent material, the sidewalls may overlap light-emitting components. Transparent sidewalls may have planar and/or curved surfaces and may be formed from clear glass, clear polymer, transparent crystalline material such as sapphire, and/or other transparent protective material. Displays (pixel arrays), light-emitting diodes covered with diffusing material, light-emitting diodes covered with patterned masks (e.g., opaque coatings with icon-shaped openings or openings of other shapes), and/or other light- emitting devices may be placed under clear sidewalls.

Figure 4:
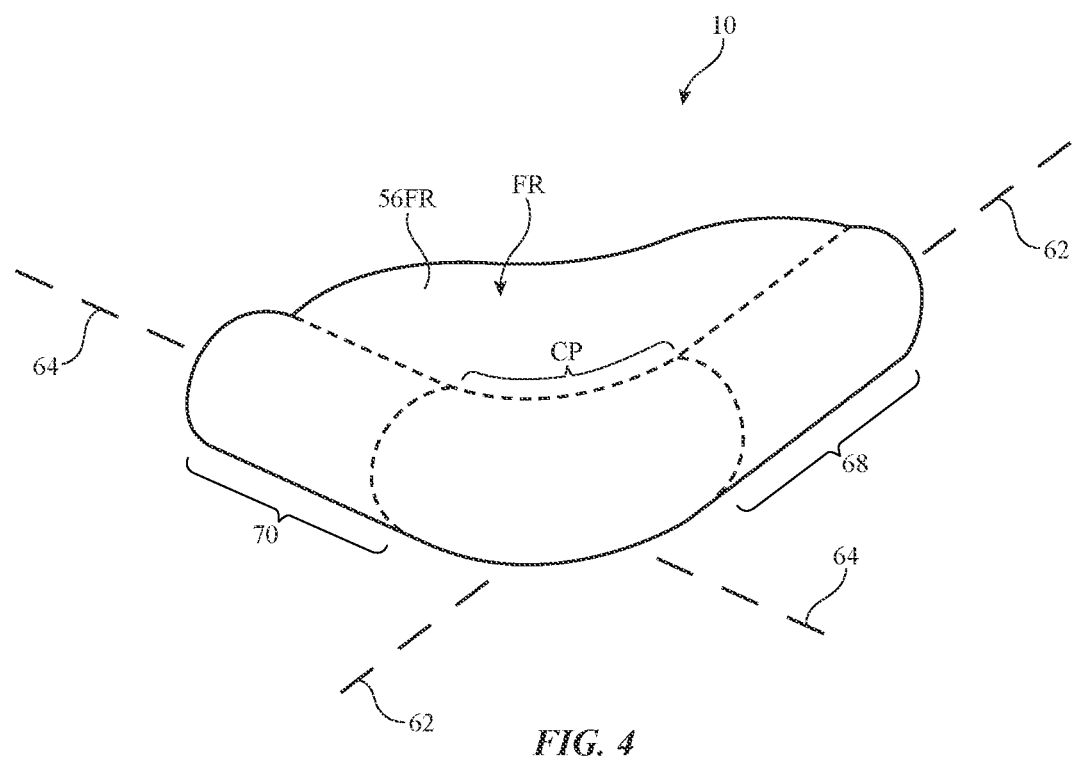
FIG. 4 is a perspective view of an illustrative corner of an electronic device in accordance with an embodiment.

If desired, device 10 may have external surfaces with compound curvature. A perspective view of an illustrative corner portion of device 10 is shown in FIG. 4. In the example of FIG. 4, device 10 has edge portions 68 and 70 formed from sidewalls W (FIG. 3). Edge portions 68 and 70 may have surfaces that curve about axes 62 and 64, respectively. These portions of housing 12 extend along the straight sides of device 10 and are characterized by curved surfaces that can be flattened into a plane without distortion (sometimes referred to as developable surfaces). At the corner of device 10 of FIG. 4, device 10 has curved surface portions CP with compound curvature (e.g., a surface that can only be flattened into a plane with distortion, sometimes referred to as a surface with Gaussian curvature). Each of the four corners of device 10 may have this arrangement, if desired.

Flexible displays such as organic light-emitting diode displays with flexible polyimide substrates or other bendable polymer substrates can be bent about axes such as axes 62 and 64 to form curved surfaces in portions 68 and 70 (e.g., these substrates may be bent without wrinkling or other undesired deformation). In compound curvature regions such as corner regions of device 10, display 14 can be formed from materials that stretch (e.g., displays formed from mesh-shaped elastomeric substrate material), may be formed from flexible displays that are patterned to create one or more flexible strips and/or other structures that can be bent to cover at least part of the compound curvature regions, may be formed from bent tab portions that are part of a display (display substrate) that also is overlapped by a display cover layer on front face FR and/or other portions of device 10, may be formed using pixels on one or more display substrates that are separate from a main central display substrate, and/or may be formed from other display structures.

To help accommodate display 14 and/or other optical components within housing 12 (e.g., in corners with compound curvature), device 10 (e.g., housing 12) may include one or more image transport layer structures (e.g., coherent fiber bundles or Anderson localization material). For example, image transport layer structures may have input surfaces (e.g., input surfaces without compound curvature) at the corners of device 10 that receive an image from a display layer and may have output surfaces of compound curvature.

The image transport layer structures may transport light (e.g., image light and/or other light) from one surface to another while preventing the light from spreading laterally and thereby preserving the integrity of the image light or other light. This allows an image produced by an array of pixels in a flat or curved display to be transferred from an input surface of a first shape at a first location to an output surface with compound curvature or other desired second shape at a second location. The image transport layer may therefore move the location of an image and may optionally change the shape of the surface on which the image is presented.

Figure 5:
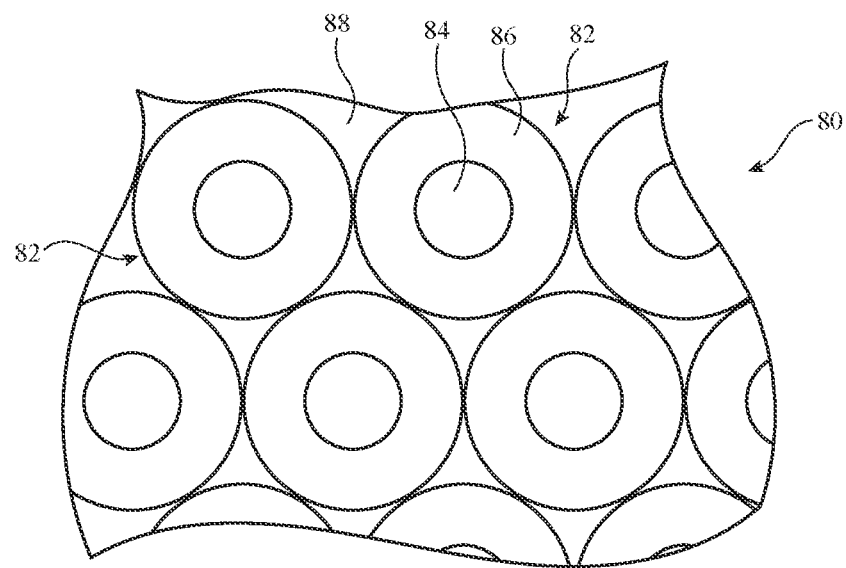
FIG. 5 is a cross-sectional side view of an illustrative image transport layer in accordance with an embodiment.

Fiber bundles include fiber cores of a first refractive index surrounded by cladding (e.g., polymer) of a second, lower refractive index. In some configurations, additional polymer, which may sometimes be referred to as binder or secondary cladding, may be included. A cross- sectional view of an illustrative image transport layer formed from a fiber bundle is shown in FIG. 5. In the example of FIG. 5, image transport layer 80 is formed from a bundle of fibers 82. Fibers 82 may have respective fiber cores 84. Cores 84 may be surrounded by material with a different index of refraction than cores 84. For example, each core 84 may have a first index of refraction and the material surrounding that core may have a second index of refraction that is lower than the first index of refraction by an index difference of at least 0.05, at least 0.1, at least 0.15, at least 10%, at least 20%, less than 50%, less than 30%, or other suitable amount. When the material surrounding cores 84 has a refractive index that is lower than cores 84, light may be guided within cores 84 in accordance with the principal of total internal reflection.

In the example of FIG. 5, cores 84, which may be formed from transparent material such as glass or polymer, are surrounded by lower index structures such as claddings 86 (e.g., glass or polymer of lower refractive index). Additional material (e.g., optional binder 88) may be included in image transport layer 80 (e.g., to hold fibers 82 in place, etc.). Binder 88 may be formed from a material (e.g., polymer or glass) with a refractive index lower than that of cores 84 and/or lower than that of cladding 86 (or equal to that of cladding 86) to promote total internal reflection in cores 84. In some configurations, cores 84 may be coated with metal and/or surrounded by air or other material to help confine light within cores 84. Arrangements in which some of cores 84, some of cladding 86, and/or some of binder 82 are formed from materials such as opaque material, colored transparent material, infrared-light-blocking-and-visible-light- transmitting material, infrared-light-transmitting-and-visible-light-blocking material, and/or other materials may also be used. For example, some of these structures may be formed from a black polymer or other light-absorbing material to help absorb stray light (e.g., light that is not being guided within cores 84). If desired, polymer 88 may be omitted (e.g. in arrangements in which cladding 86 is used to hold fibers 82 together in image transport layer 80).

The diameters of cores 84 may be, for example, at least 5 microns, at least 7 microns, at least 8 microns, at least 9 microns, less than 40 microns, less than 17 microns, less than 14 microns, less than 11 microns, or other suitable diameter. Fibers 82 may have diameters of at least 6 microns, at least 7 microns, at least 8 microns, at least 9 microns, less than 50 microns, less than 17 microns, less than 14 microns, less than 11 microns, or other suitable diameter.

Figure 6:
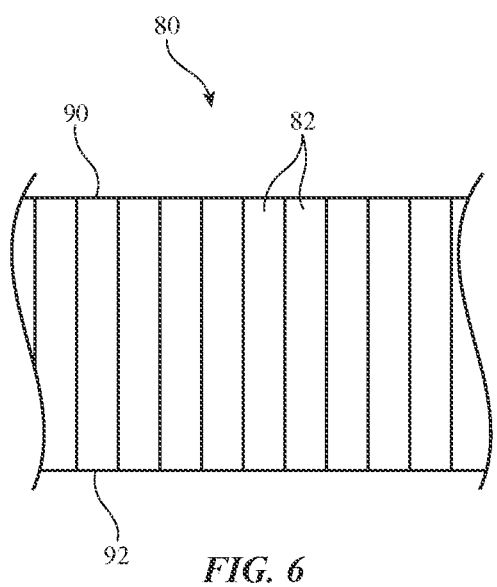
FIG. 6 is a cross-sectional side view of an illustrative image transport layer in accordance with an embodiment.

As shown in FIG. 6, fibers 82 may extend parallel to each other in image transport layer 80 (e.g., the fibers may be straight from end to end and may run next to each other along the direction of light propagation through the fiber bundle). This allows image light or other light that is presented at input surface 90 to be conveyed to output surface 92. In the example of FIG. 6, surfaces 90 and 92 are planar and fibers 82 extend in straight lines between surfaces 90 and 92. Other arrangements such as arrangements in which fibers 82 are bent and/or taper and/or in which surface 90 and/or surface 92 have curved cross-sectional profiles may also be used.

In general, image transport layer 80 may be formed from a coherent fiber bundle (see, e.g., FIG. 5) or may be formed from Anderson localization material instead of a coherent fiber bundle. Anderson localization material is characterized by transversely random refractive index features (higher index regions and lower index regions) of about two wavelengths in lateral size that are configured to exhibit two-dimensional transverse Anderson localization of light (e.g., the light output from the display of device 10). These refractive index variations are longitudinally invariant (e.g., along the direction of light propagation, perpendicular to the surface normal of a layer of Anderson localization material). Configurations in which image transport layer 80 has a bundle of fibers 82 are sometimes described herein as an example.

Fiber bundles and Anderson localization material can be used to form plates (e.g., layers with a thickness of at least 0.2 mm, at least 0.5 m, at least 1 mm, at least 2 mm, at least 5 mm, less than 20 mm, or other suitable thickness) and/or other image transport structures (e.g., straight and/or bent elongated light pipes, spherical shapes, cones, tapered shapes, etc.). As described in connection with FIG. 6, the surfaces of image transport structures may be planar and/or may have curved profiles.

Image transport layers can be used to transport an image from a first surface (e.g., the surface of a pixel array) to a second surface (e.g., a surface in device 10 with compound curvature or other curved and/or planar surface shape) without causing the image light to spread laterally. For example, an image that is produced by a display can be transported 5 mm vertically through an image transport layer that is 5 mm thick and can then be viewed on the output surface of the image transport layer. As another example, an image transport layer may have a planar input surface and an output surface with a planar central region surrounded by curved edges and corners of compound curvature. With this type of arrangement, images produced by a display that rests against the planar input surface can be smoothly transported to an output surface without becoming blurred, even if the output surface contains curved portions such as areas of compound curvature. Curved image transport layer surfaces can be formed by polishing, slumping heated fiber bundle material, molding under heat and/or pressure, etc. In devices with optical sensors and other optical components, light may, if desired, be transported through an image transport structure to and/or from an optical component.

In portions of device 10 that have an externally viewable display, a display cover layer that forms at least part of housing 12 may be used to cover and protect image transport layer 80 or an image transport layer that is uncovered by a separate display cover layer may be used in forming at least part of housing 12.

In arrangements in which a display cover layer is used to cover and project layer 80, adhesive, touch sensor structures, diffuser layers, masking layers, filter layers, antireflection layers, and/or other structures may optionally be interposed between layer 80 and the display cover layer. The display cover layer may be formed from glass, polymer, ceramic, crystalline material such as sapphire, multiple layers of these materials and/or other materials and may have optional coatings (e.g., an antireflection layer, an antiscratch layer, an antismudge layer, etc.). The display cover layer may form some or all of housing 12 of FIG. 3. A display layer with an array of pixels that displays an image may be located within the interior of housing 12. Image transport layer 80 may be interposed between the array of pixels and the display cover layer so that the image on the pixel array is transported from the input surface of the image transport layer to the output surface of the image transport layer. The image on the output surface of the image transport layer is visible through the display cover layer forming the portion of housing 12 that overlaps the image transport layer.

In arrangements in which no display cover layer is present, one or more portions of housing 12 of FIG. 3 may be formed from an image transport layer that is not covered with a separate protective member. For example, an image transport layer with a planar central portion, curved peripheral edges, and corners of compound curvature may be used to form an upper portion and sidewall portion of housing 12. In this type of configuration, the outside of image transport layer 80 is not covered with a separate display cover layer member so that output surface 92 forms the outermost surface of housing 12 of FIG. 3. The pixel array may be formed against input surface 90 of the image transport layer, which may form the innermost surface of housing 12 of FIG. 3.

During use, output surface 92 may contact external objects. To prevent damage to image transport layer 80 (e.g., the portion of housing 12 of FIG. 3 that overlaps the pixel array), output surface 92 may be strengthened using a chemical strengthening process or other strengthening process. For example, in a scenario in which layer 80 is formed from glass, surface 92 of layer 80 may be strengthened using an ion exchange chemical strengthening treatment and/or other strengthening processes (e.g., heat treatment, etc.). Chemical strengthening may be performed by placing a glass image transport layer in a heated potassium salt bath to perform an ion-exchange process. Chemical strengthening in this way may enhance the compressive stress of the outermost surfaces of the glass image transport layer relative to deeper portions. Heat treatment (e.g., thermal tempering) may also be used to create compressive stress on outer surfaces of image transport layer 80. By creating compressive stress on the surface of image transport layer 80, the strength of output surface 92 may be enhanced. If desired, an antiscratch coating, an antireflection coating, an antismudge coating, and/or other exterior coating layers may be applied to surface 92. When layer 80 is strengthened at output surface 92, layer 80 is able to withstand damage during drop events and other events that impose stress on layer 80.

Figure 7:
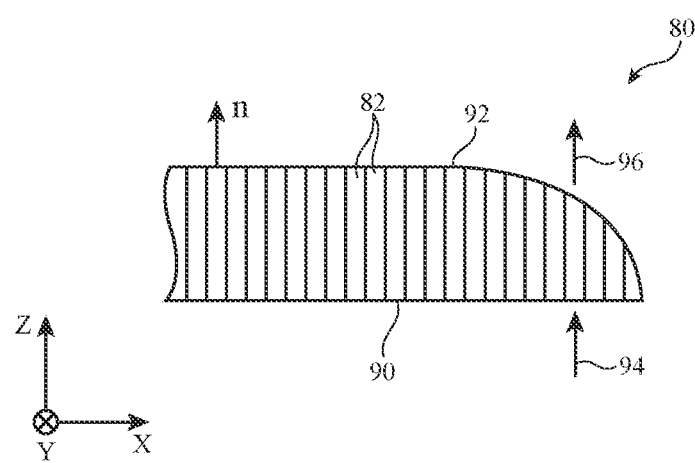
FIG. 7 is cross-sectional side view of a portion of an illustrative image transport layer with vertically oriented light guiding structures such as vertically oriented fibers in accordance with an embodiment.

An illustrative image transport layer 80 that has a curved output surface is shown in FIG. 7. Image transport layer 80 of FIG. 7 has straight fibers 82 that run parallel to each other. In the orientation of FIG. 7, fibers 82 run vertically, so that each fiber 82 extends along a longitudinal axis that is parallel to the Z axis of FIG. 7 (e.g., parallel to surface normal n of a planar portion of the outer surface of image transport layer 80). In this type of arrangement, an image from a display that is presented to input surface 90 may be transported to output surface 92 vertically through image transport layer 80. Light may enter input surface 90 in light entrance direction 94 and may exit output surface 92 in light exit direction 96. When fibers 82 are straight and the longitudinal axes of fibers 82 are oriented vertically, each fiber 82 has an exit portion that is aligned parallel to light emission direction 96 (e.g., a direction facing a viewer), so that light emitted from the curved edge portion of image transport layer 80 will be directed toward the viewer rather than being angled significantly away from the viewer. If desired, the entrance and output facets of each fiber may be oriented at non-zero angles (e.g., to help ensure that light exiting the fibers is emitted in a desired direction). Optional grooves and other structures may also be formed in image transport layer 80. Input surface 90 and/or output surface 92 may have any suitable shapes (e.g., these surfaces may have planar portions, portions with curved cross-sectional profiles, areas of compound curvature, etc.).

Output surface 92 may form the outermost surface of device 10 and/or may be covered with a display cover layer (e.g., a layer of glass, polymer, transparent ceramic, crystalline material such as sapphire, and/or other transparent member that is separate from layer 80 and that overlaps output surface 92). In arrangements in which a display cover layer is used to cover and project layer 80, adhesive, touch sensor structures, diffuser layers, masking layers, filter layers, antireflection layers, and/or other structures may optionally be interposed between layer 80 and the display cover layer. The display cover layer may be formed from glass, polymer, ceramic, crystalline material such as sapphire, multiple layers of these materials and/or other materials and may have optional coatings (e.g., an antireflection layer, an antiscratch layer, an antismudge layer, etc.). In arrangements in which no display cover layer is present, output surface 92 may be strengthened using a chemical strengthening process or other strengthening process. For example, in a scenario in which layer 80 is formed from glass, surface 92 of layer 80 may be strengthened using an ion exchange chemical strengthening treatment and/or other strengthening processes (e.g., heat treatment, etc.). An antiscratch coating, antireflection coating, antismudge coating, and/or other exterior coating layers may also be applied to surface 92. When layer 80 is strengthened at surface 92 in this way, layer 80 is able to withstand damage during drop events and other events that impose stress on layer 80.

Figure 8:
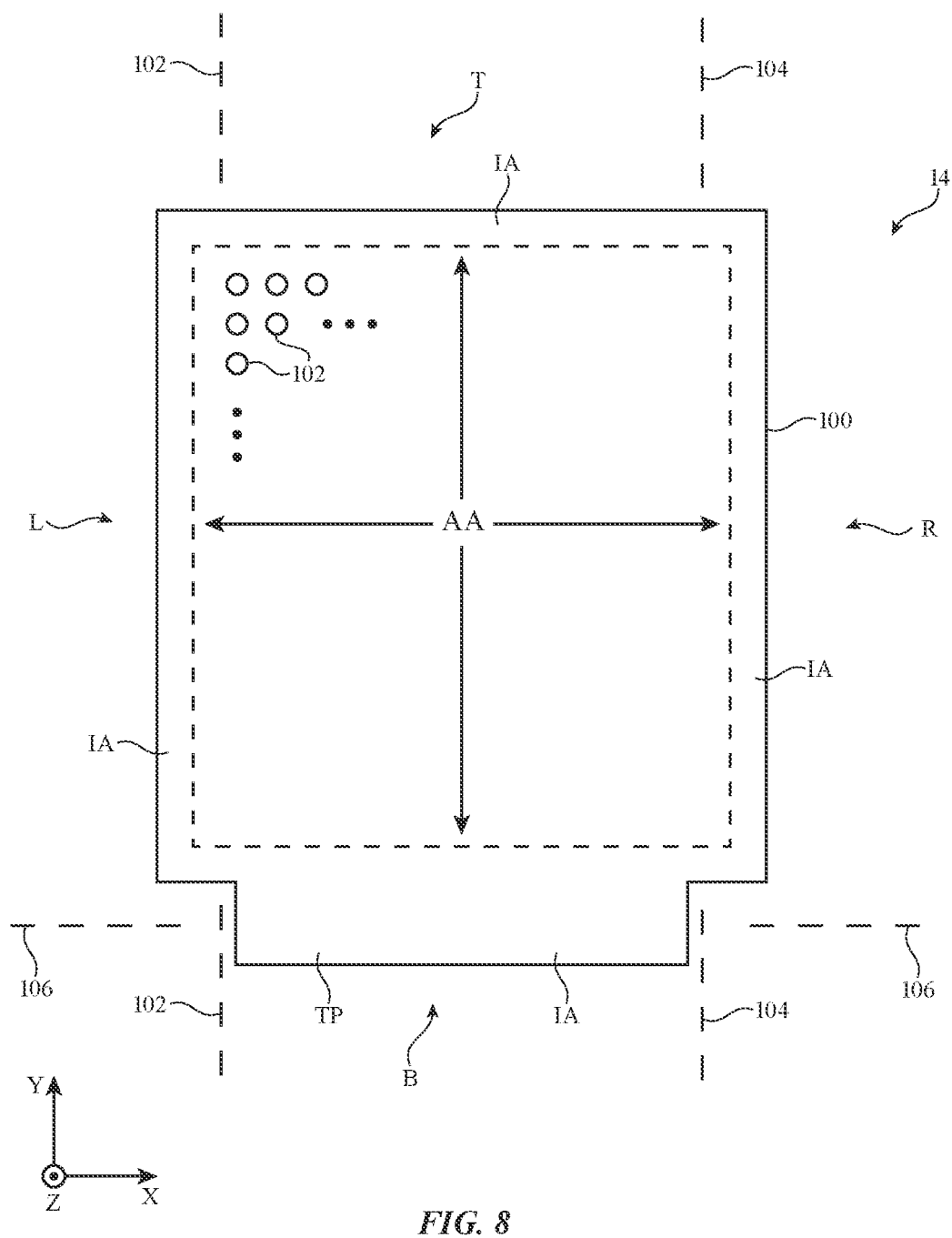
FIG. 8 is a top view of an illustrative flexible display layer showing three bend axes at the left, right, and lower edges of the layer around which the layer may be bent in accordance with an embodiment.

FIG. 8 is a top view of an illustrative display for device 10. As shown in FIG. 8, display 14 may include an array of pixels 102 formed on flexible display layer 100. Pixels 102 may be thin-film pixels such as organic light-emitting diode pixels and layer 100 may include a flexible polyimide display substrate and/or other flexible display layers. Configurations in which flexible display layer 100 is formed from other types of display pixels may also be used. The use of a flexible organic light-emitting diode display to form layer 100 is illustrative. If desired, capacitive touch sensor electrodes may be incorporated into the thin-film circuitry of an organic light-emitting diode display substrate or a capacitive touch sensor panel may be laminated to an organic light-emitting diode display substrate to form a touch-sensitive display for device 10.

Display layer 100 may have an active area AA that is surrounded by an inactive display border such as inactive area IA. Active area AA contains an array of pixels 102 and is configured to display an image for a user of device 10. Inactive area IA is free of pixels and does not display images for a user. Inactive area IA may contain routing lines, display driver circuitry (e.g., thin-film circuitry and/or integrated circuits), encapsulation and test structures, and/or other structures that do not emit light. To minimize the visibility of inactive border portions of display 14 from a viewer (e.g., a user of device 10 who is viewing display 14 along the—Z direction of FIG. 8), one or more edges of flexible display layer 100 may be bent downwards (in the—Z direction) out of the X-Y plane of the central portion of flexible display layer 100.

In the example of FIG. 8, the portion of flexible display layer 100 at top edge T is not bent. Left edge L of flexible display layer 100 is bent about left bend axis 102, which runs parallel to the left edge of display layer 100. Right edge R of flexible display layer 100 is bent about right bend axis 104, which runs parallel to the right edge of display layer 100. By bending the left and right portions of display 100 downwards and placing an image transport layer over display layer 100, inactive areas IA along left edge L and right edge R may be partly or completely hidden from view. A tail portion TP of inactive area IA along lower edge B may be bent around lower edge bend axis 106, which runs parallel to lower edge B of display layer 100. This helps hide tail portion TP from view while maintaining a compact form factor for device 10. Tail portion TP may include signal paths (e.g., data lines, gate lines, power lines, etc.) and may, if desired, include display driver circuitry. In the interior of device 10, tail portion TP may be electrically connected to a printed circuit (see, e.g., printed circuit 48 of FIG. 3).

Figure 9:
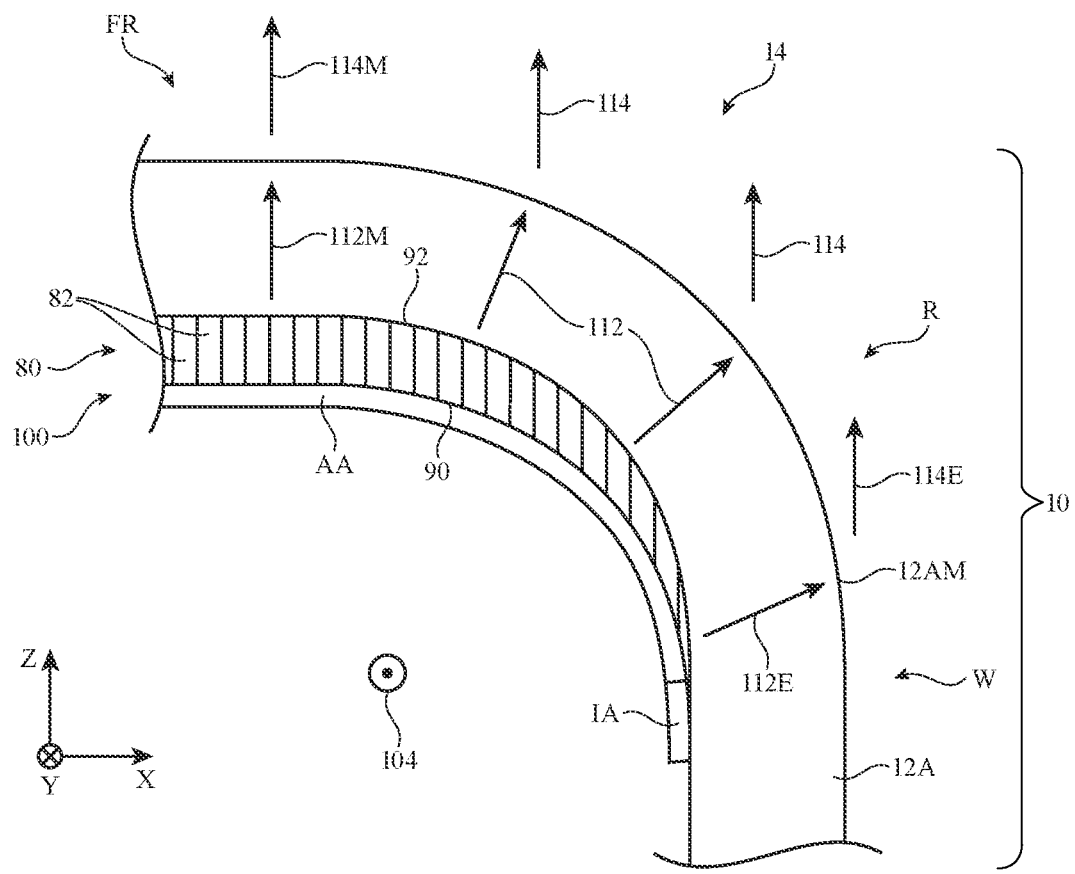
FIG. 9 is a cross-sectional side view of an illustrative electronic device showing how left and right edges of the display layer of FIG. 8 may be bent in accordance with an embodiment.

FIG. 9 is a cross-sectional side view of an illustrative right-hand edge portion of device 10. The structures of FIG. 9 may also be used along left edge L of device 10 (e.g., by flipping the structures of FIG. 9 from right to left).

As shown in FIG. 9, flexible display layer 100 may have a planar central portion (e.g., a portion that lies in a plane that is parallel to the X-Y plane of FIG. 9). Flexible display layer 100 may also have an edge portion (e.g., a strip) that runs along right edge R of device 10 and that has a curved cross-sectional profile. This edge portion of layer 100 may be bend downward in the —Z direction about right edge band axis 104. By bending the inactive area and active area edge portions of layer 100 about axis 104 as shown in FIG. 9, inactive area IA of display layer 100 along right edge R may be hidden from view from the front of device 10.

Image transport layer 80 may have straight vertically oriented fibers 82. Input surface 90 of layer 80 may receive an image from active area AA. Layer 80 may transport this image to output surface 92. Fibers 82 in layer 80 may have a different refractive index (e.g., a lower refractive index) than transparent housing portion 12A and/or output surface 92 may be offset from transparent housing portion 12A by an air gap. As a result, emitted light 112 at output surface 92 may refract when entering the display cover layer formed from transparent housing portion 12A. Emitted light rays from the pixels of display layer 100 that exit output surface 92 in the center of display 14 may pass through the display cover layer without substantial refraction and may therefore pass through the display cover layer vertically, parallel to the Z axis, as illustrated by central light ray 112M of FIG. 9. Emitted light rays from the edge of active area AA (e.g., the rightmost emitted light rays from display layer 100 such as illustrative emitted ray 112E) may be refracted to the right and pass through the display cover layer at a non-zero angle with respect to the Z axis. Upon reaching outermost surface 12AM of the display cover layer, these rays from the edge of active area AA may be refracted back in a direction that is closer to the Z axis (e.g., parallel to or nearly parallel to the Z axis), as shown by illustrative light ray 114E.

The refraction of image light exiting surface 92 towards the edge of device 10 (e.g., away from the Z axis) that occurs when rays such as ray 112E enter the display cover layer formed by transparent housing layer 12A and the subsequent refraction of image light back towards the Z axis that occurs when rays such as ray 114E exit the display cover layer formed by transparent housing layer 12A helps stretch the edges of the image presented to the user outward (e.g., to enlarge the apparent size of display 14 in the X-Y plane). As a result, display 14 has a larger effective area and the stretching process due to the refracted light tends to partly or completely obscure inactive area IA at the border of layer 100. The refraction process may also expand the viewed active area of display 14 sufficiently to make display 14 appear borderless or nearly borderless (e.g., opaque sidewall housing structures along sidewall W may also be hidden from view).

Figure 10:
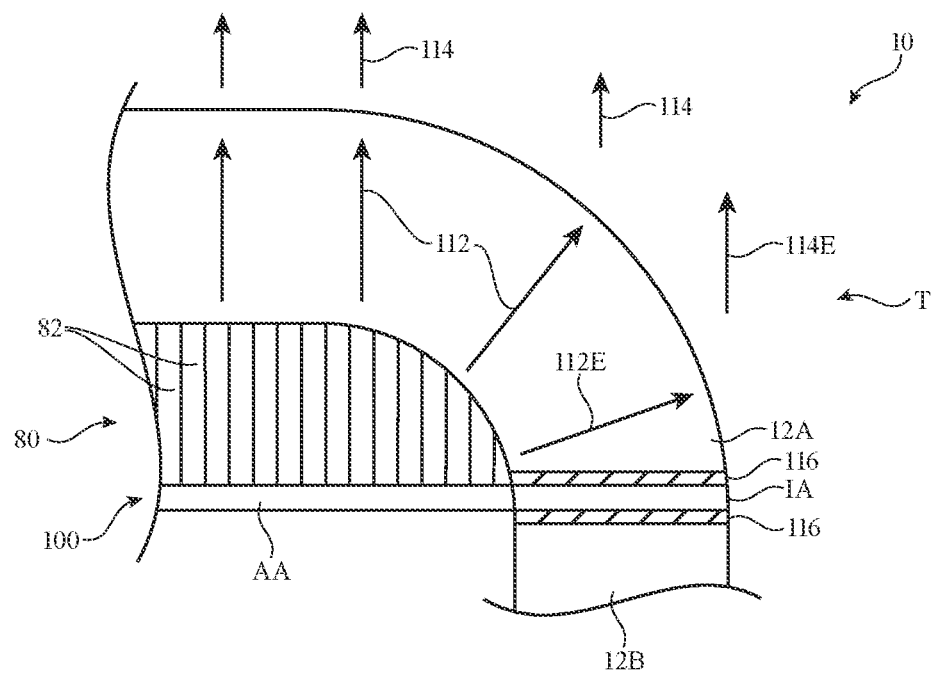
FIG. 10 is a cross-sectional side view of an illustrative electronic device showing how an upper unbent edge of the display layer of FIG. 8 may be accommodated within the device in accordance with an embodiment.

As shown in FIG. 10, along upper edge T of device 10 (e.g., in the middle of upper edge T), active area AA and inactive area IA of layer 100 are unbent. Inactive area IA of layer 100 of FIG. 8 may be interposed between adhesive layers 116 of FIG. 10. One of adhesive layers 116 may attach a surface of transparent housing portion 12A to an upper surface of display layer 100 in inactive area IA and one of adhesive layers 116 may attach a corresponding facing surface of lower housing portion 12B to an opposing lower surface of display layer 100 in inactive area IA. If desired, other attachment mechanisms (e.g., welds, gaskets, etc.) may be used in coupling portions of housing 12 together. The use of adhesive 116 in the example of FIG. 11 is illustrative.

Layer 100 (in this example) is bent about left bend axis 102 and right bend axis 104, and is therefore not also bent about an axis parallel to upper edge T to avoid wrinkling display layer 100 at upper edge T. As described in connection with FIG. 9 and as illustrated by light rays 112E and 114E, the refraction of image light from active area AA by the display cover layer formed from transparent housing portion 12A may help expand active area AA towards edge T and thereby help conceal inactive area IA and other structures (e.g., opaque structures in housing portion 12B).

Figure 11:
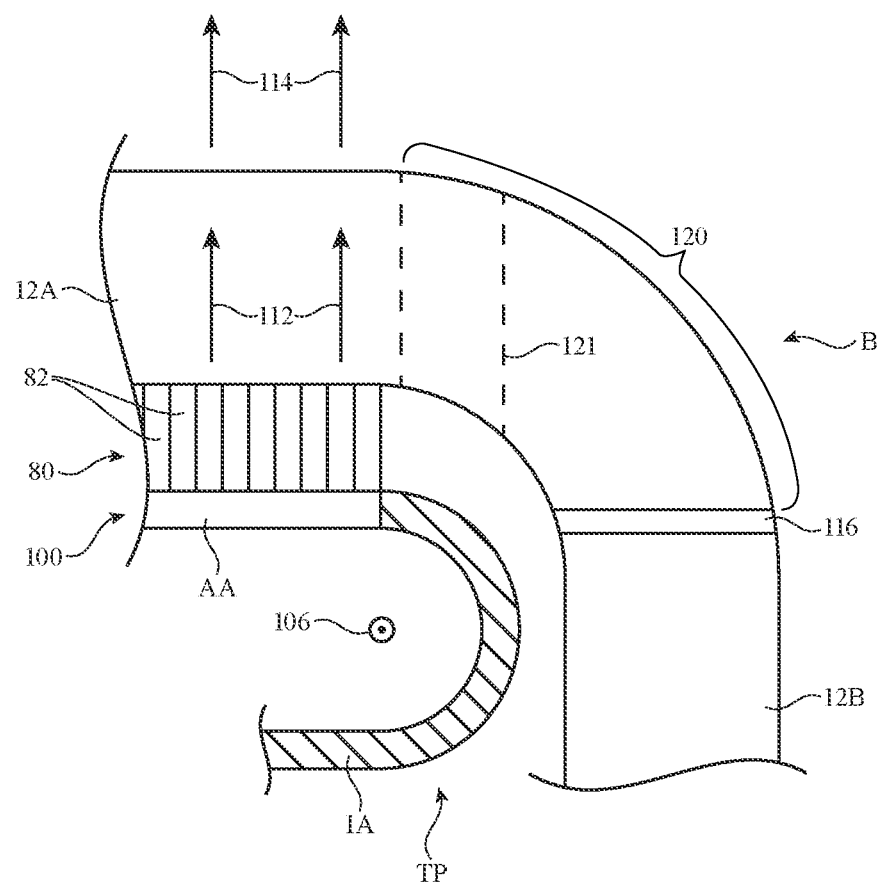
FIG. 11 is a cross-sectional side view of an illustrative electronic device showing how the bent lower edge of the display layer of FIG. 8 may be accommodated within the device in accordance with an embodiment.

Along the lower edge B of device 10, tail portion TP of inactive area IA of layer 100 of FIG. 8 may be bent about bend axis 106, as shown in FIG. 11. Bend axis 106 may be laterally offset from active area AA, so that only inactive portions of layer 100 along lower edge B are bent. Adhesive 116 or other suitable attachment structures may be used to attach upper housing portion 12A and lower housing portion 12B. Due to the placement of image transport layer 80, there may be a region (see, e.g., region 120 of FIG. 11) from which no image light is emitted. If desired, an opening such as optional opening 121 may be formed in region 120 (e.g., to accommodate sound from a speaker, etc.). Other components (e.g., ambient light sensors, proximity sensors, image sensors, etc.) may also be overlapped by transparent housing portion 12A in region 120, if desired. If desired, opening 121 and the structures of FIG. 11 may be formed along upper edge T and the structures of FIG. 10 may be formed along lower edge B (e.g., display layer 100 of FIG. 8 may be bent along upper edge T and unbent along lower edge B).

Figure 12:
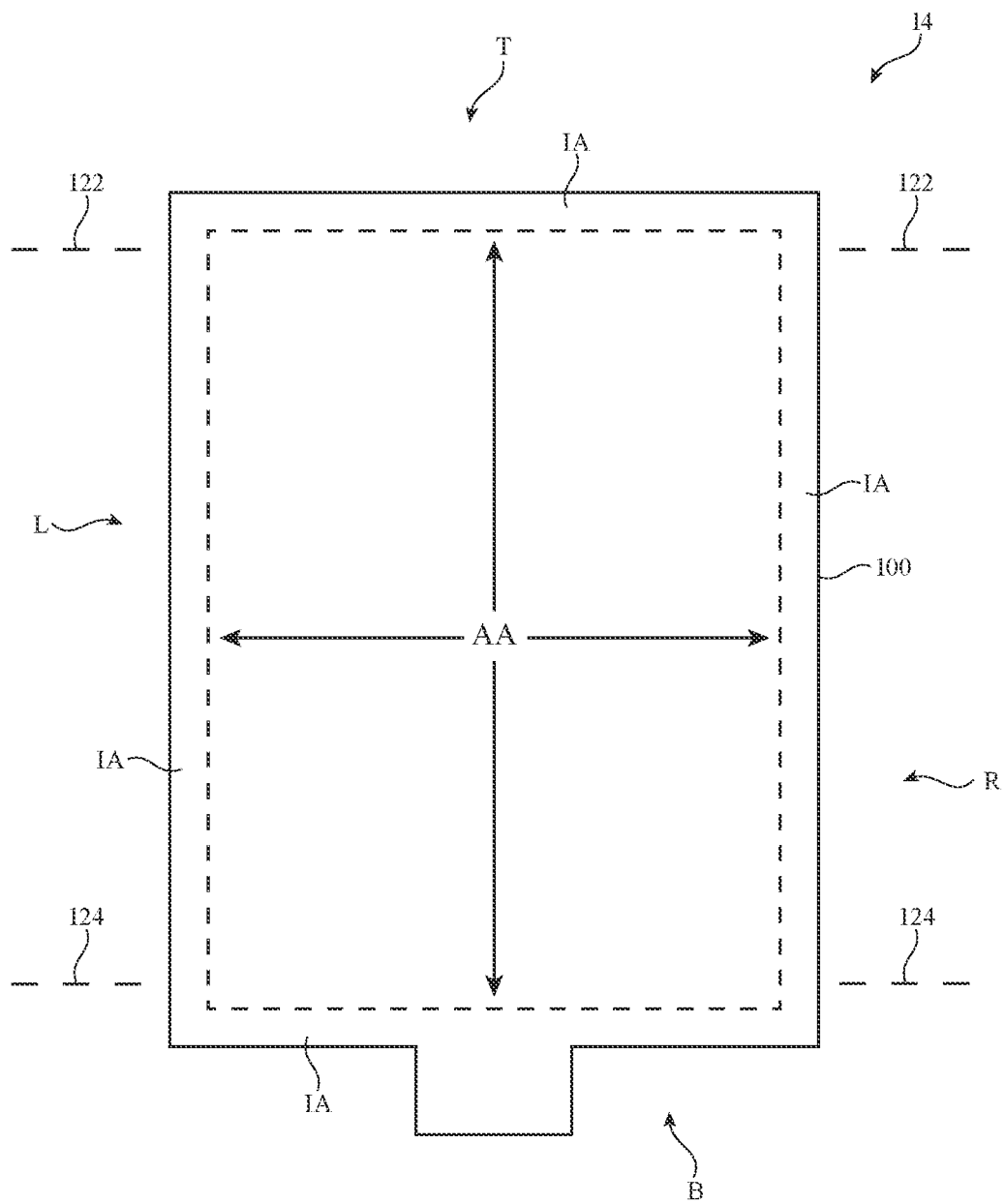
FIG. 12 is a top view of an illustrative flexible display layer showing upper edge and lower edge bend axes around which the layer may be bent while leaving opposing left and right edges unbent in accordance with an embodiment.

Another illustrative configuration for bending display layer 100 is shown in FIG. 12. In this type of arrangement, display layer 100 is bent only along its upper and lower edges. As shown in FIG. 12, for example, upper edge T of display layer 100 may be bent about bend axis 122 and lower edge B of display layer 100 may be bent about bend axis 124. Left edge L and opposing right edge R may be unbent (e.g., these portions of display layer 100 may be planar and may, if desired, be interposed between the lower surface of a display cover layer and an opposing upper surface of a rear housing portion or other opposing housing structure as described in connection with inactive area IA of FIG. 10).

Figure 13:
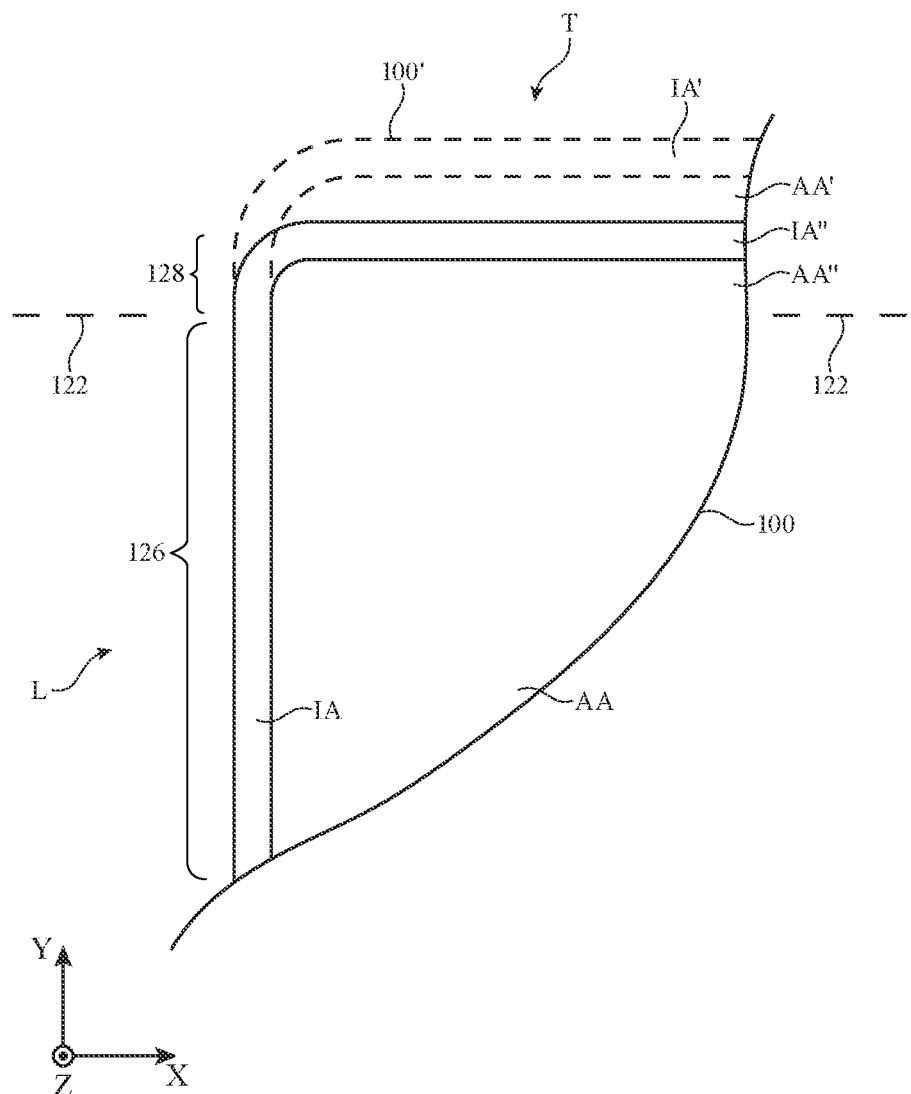
FIG. 13 is a top view of a corner portion of an illustrative flexible display layer in accordance with an embodiment.

FIG. 13 is a top view of an illustrative upper left corner portion of display layer 100 of FIG. 12. Dashed lines 100' correspond to the location of display layer 100 before the portion of display layer 100 along upper edge T is bent about bend axis 122. To ensure that display 14 has a desired shape (e.g., evenly rounded corners), active area portion AA' may have an elongated shape (e.g., the active area border may be stretched out at the corner as shown in FIG. 13). After bending about axis 122, active area portion AA' may lie in active area region AA" and inactive area portion IA' may lie in active area region IA" when display 14 is viewed in direction—Z by a user (e.g., the upper edge of display layer 100 will be compressed inwardly into horizontal strip region 128 running along upper edge T). In region 126, display layer 100 is not bent and may have a planar shape. This type of arrangement may be used in each of the four corners of display 14 to ensure that the pixels of the active area of display 14 display an image with evenly rounded corners or corners of other desired shapes.

Figure 14:
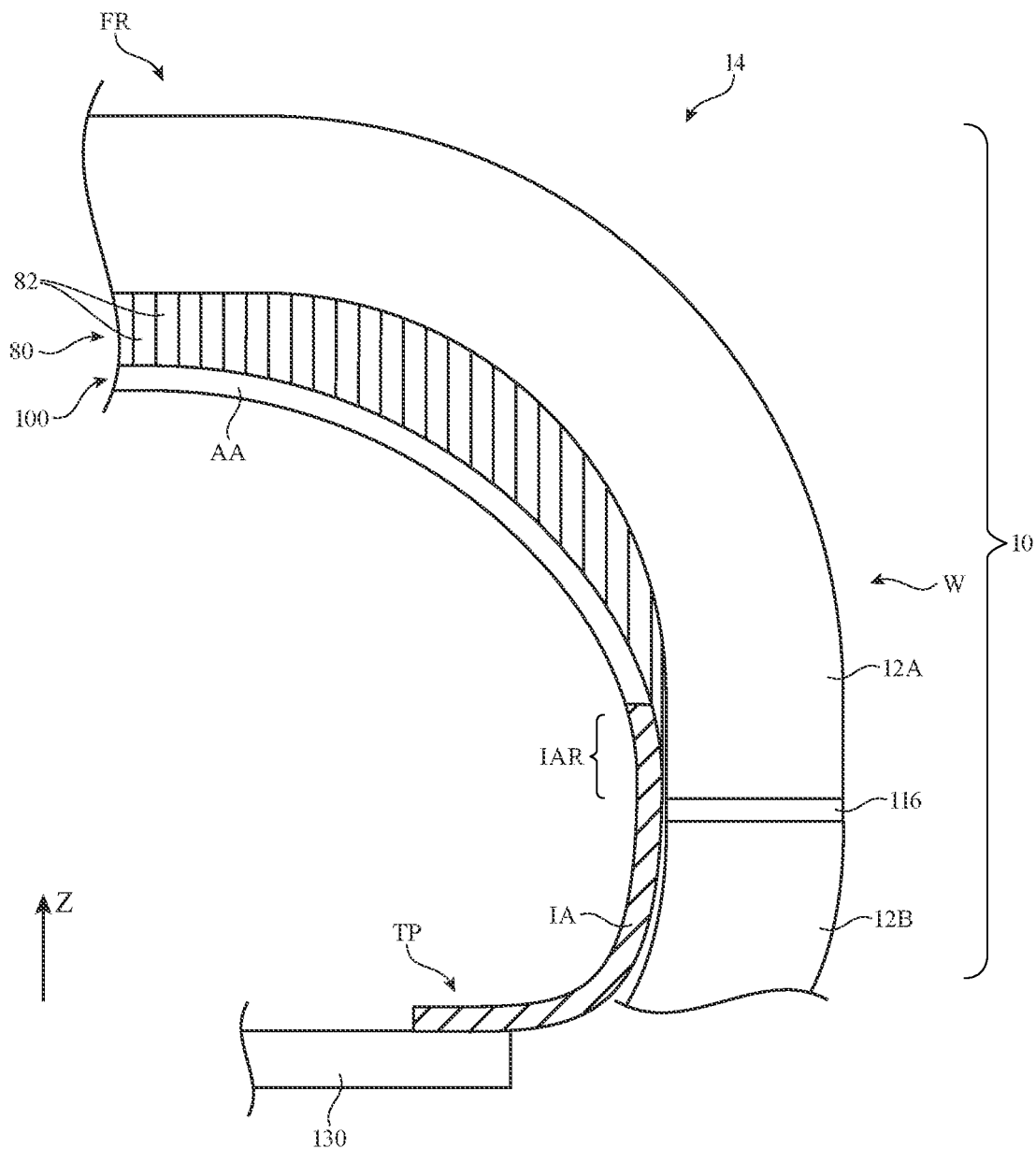
FIG. 14 is a cross-sectional side view of an illustrative electronic device showing structures that may be used along the upper and lower bent edges of the flexible display layer of FIG. 12 in accordance with an embodiment.

FIG. 14 is a cross-sectional side view of device 10 showing structures of the type that may be used along upper edge T and lower edge B of device 10 when provided with a flexible display layer that has been bent along its upper and lower edges such as display layer of FIG. 13. Along upper edge T, the bent portion of layer 100 that includes inactive area IA may extend only into region IAR. The use of image transport layer 80 and refraction in the display cover layer formed by transparent upper housing portion 12A may help make display 14 borderless or nearly borderless along upper edge T (e.g., the inactive area of display 14 and opaque portions of housing portion 12B may be hidden from view from a user who is viewing display 14 straight on along the—Z direction). Along lower edge B, bent inactive area IA may have a longer tail portion that is likewise hidden from view. This lower tail portion (e.g., tail portion TP of FIG. 14) may, if desired, be electrically coupled to circuitry in the interior of device 10. For example, metal traces on tail portion TP may form data lines, gate lines, power paths, and other signal paths that are electrically coupled to corresponding paths on printed circuit 130 (e.g., a printed circuit such as printed circuit 48 of FIG. 3) and/or other circuitry within device 10 (see, e.g., components 50 of FIG. 3). Image transport layer 80 may have inner and outer surfaces with curved cross-sectional profiles to help accommodate the bent shape of display layer 100 along upper edge T and lower edge B. Along left edge L and right edge R, where display layer 100 is unbent, the input surface of image transport layer 80 may have planar portions that receive image light from corresponding planar portions of display layer 100. Refraction through curved edge portions of the display cover layer 100 may, if desired, hide inactive area IA from view along the left and right edges.

In corner portions of display 14, the output surface of image transport layer 80 and the corresponding inner surface of the display cover layer formed from transparent housing portion 12A may have compound curvature, as described in connection with FIG. 4. The input surface of image transport layer 80 may have a shape that follows the surface shape of display layer 100. As a result, each corner portion of image transport layer 80 may have an input surface area that has a curved developable surface that follows a corresponding curved developable surface of display layer 100 in that corner and each corner portion of image transport layer 80 may have a corresponding output surface area of compound curvature.

Figure 15:
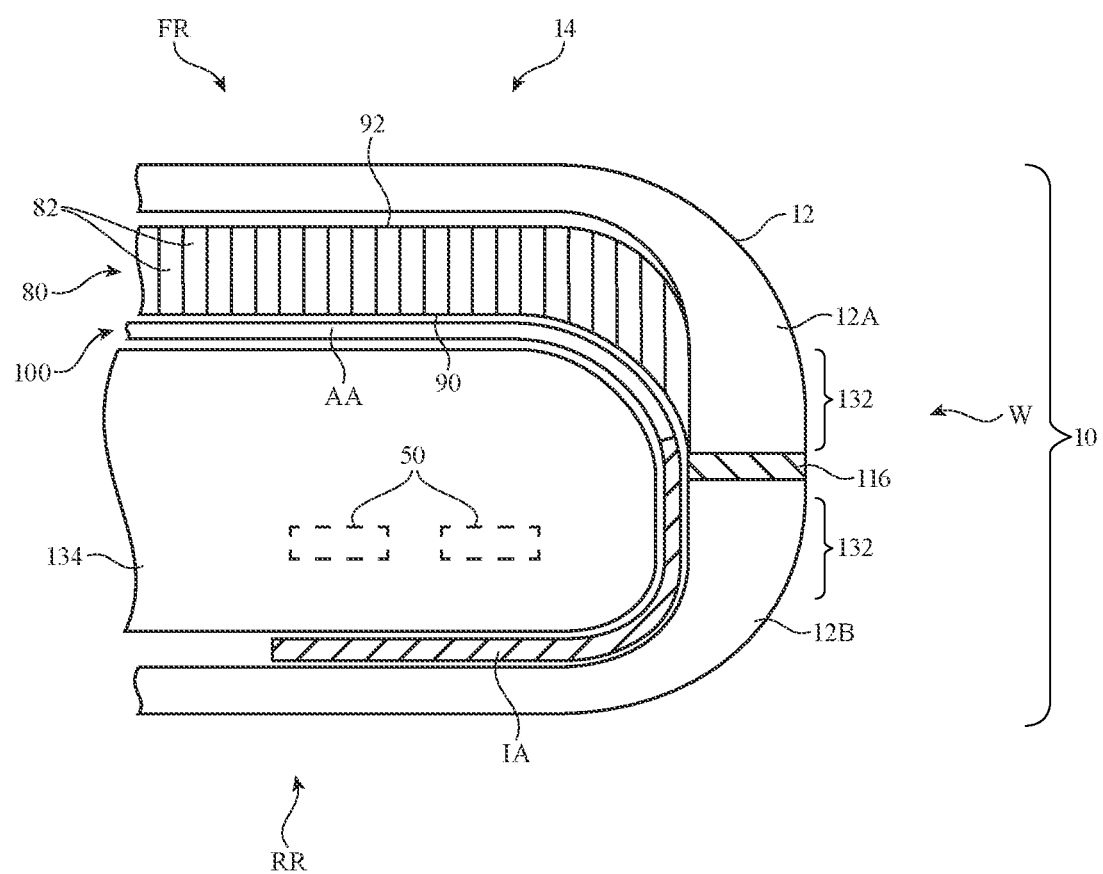
FIG. 15 is a cross-sectional side view of an illustrative electronic device having an image transport layer of even thickness, a bent flexible display, and cover glass members with flared edge portions that form a sidewall with an enhanced thickness relative to other housing walls in accordance with an embodiment.

If desired, image transport layer 80 may have a relatively constant thickness across its width and length. FIG. 15 is a cross-sectional side view of a portion of an illustrative electronic device showing how image transport layer 80 may have a constant thickness so that input surface 90 has the same shape as output surface 92. Housing 12 may have portions 12A and 12B that are attached to each other using attachment structures such as adhesive 116. To help strengthen housing 12, sidewall portions of housing 12 (e.g., sidewall portions of upper housing portion 12A and/or sidewall portions of lower housing portion 12B in regions 132 along sidewall W) may have increased thickness relative to the thickness of housing 12 elsewhere in device 10. For example, the thickness of housing 12 in regions 132 (e.g., the thickness of housing sidewall W) may be greater than the thickness of housing 12 on front face FR and/or on rear face RR (e.g., the thickness of the center of the display cover layer and/or the thickness of the rear housing wall of device 10).

In the illustrative configuration of FIG. 15, flexible display layer 100 has been bent downward at sidewall W around internal flexible display support structure 134. Structure 134 may be, for example, a polymer chassis structure with a curved outer surface that supports layer 100 and that prevents excessively sharp bends in layer 100. If desired, structure 134 may have a hollow region forming an interior cavity in which electrical components 50 are mounted.

Figure 16:
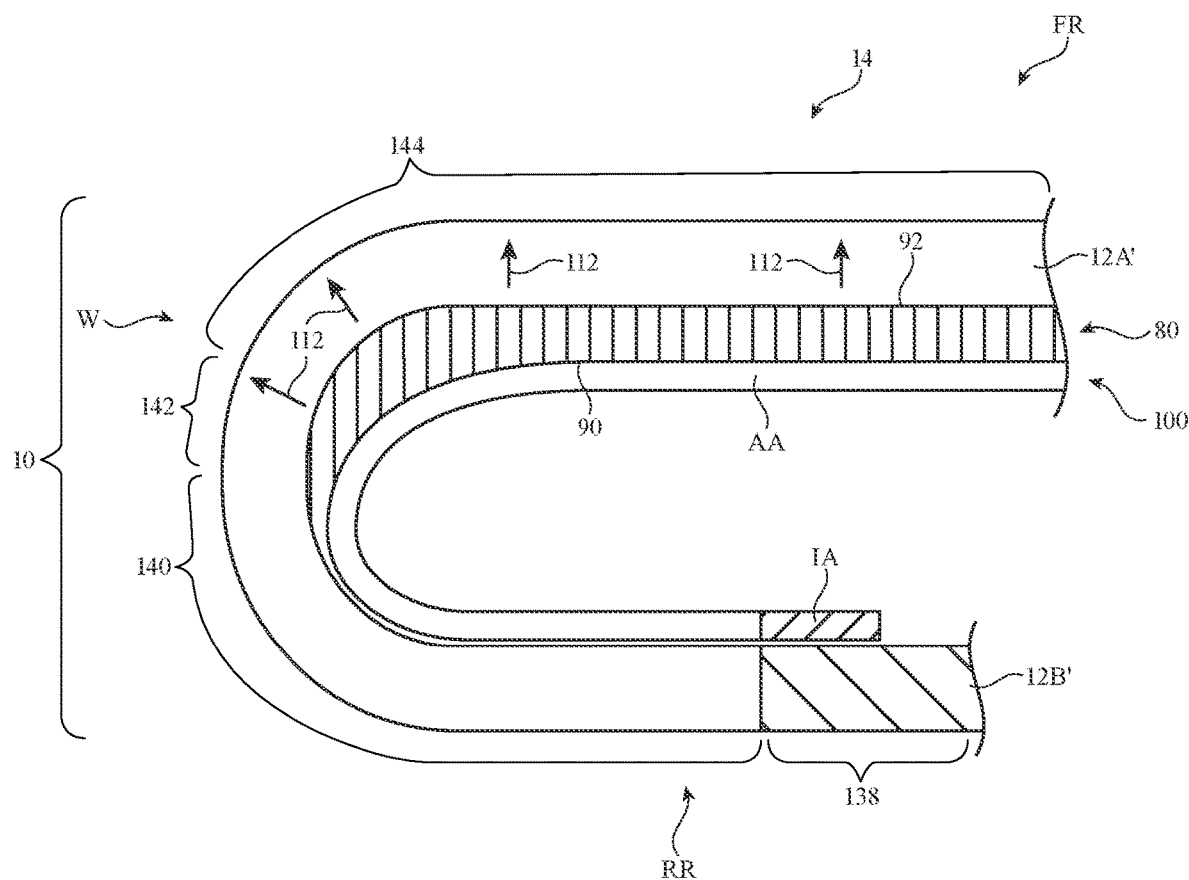
FIG. 16 is a cross-sectional side view of an illustrative electronic device with an image transport layer on a front face of the device and a bent flexible display layer that forms a strip of display area running along an edge portion of a rear face of the device in accordance with an embodiment.

As shown in the illustrative configuration of FIG. 16, housing portion 12A' may have a portion that wraps around the edge of device 10 from front face FR to rear face RR. Housing portion 12A' may be formed from glass or other transparent material that allows housing portion 12A' to serve as a display cover layer for display 14. Housing portion 12A' may protect image transport layer 80 from damage. Image transport layer 80 may cover a portion of active area AA that faces front face FR of device 10. An image displayed by this portion of the active area may be viewable in region 144 of display 14. Due to the presence of image transport layer 80 and refraction of edge light rays by the portion of the transparent housing portion 12A' along sidewall W, the edge of region 144 may overlap some or most of housing portion 12A' on sidewall W when front face FR of device 10 is viewed straight on, thereby providing display 14 with a borderless or nearly borderless appearance when viewed from the front of device 10.

When viewed from the edge of device 10, there may be a small area 142 that does not contain any visible portion of the image from active area AA. Active area AA may wrap around the inner surface of housing portion 12A' on sidewall W and may be covered by a strip of housing portion 12A' that runs along the edge of device 10 on rear face RR. This allows an additional image to be displayed by the portion of active area AA in region 140. Region 140 may include a first potion that is visible from the side of device 10 (e.g., along sidewall W) and a second portion that is visible on rear face FR. Text, notifications, graphics, and/or other content may be displayed in region 140. This content can be associated with the content being displayed on front face FR or may be different content. For example, region 140 may be used to display notifications when incoming messages are received and/or may display message content (e.g., text messages). This may allow a user who is resting device 10 on a table in a face down configuration (e.g., with front face FR facing downwards towards the table and rear face RR facing upwards) to view notifications and message content. To conserve power, images may be displayed in region 140 without displaying images in region 144.

Inactive area IA may be overlapped by housing portion 12B' in region 138. Housing portion 12B' may be formed from metal, glass covered with an inner and/or outer opaque masking layer such as a layer of ink, and/or other opaque housing structures that block inactive area IA from view from the exterior of device 10 (e.g., when a user is viewing rear face RR).

Figure 17:
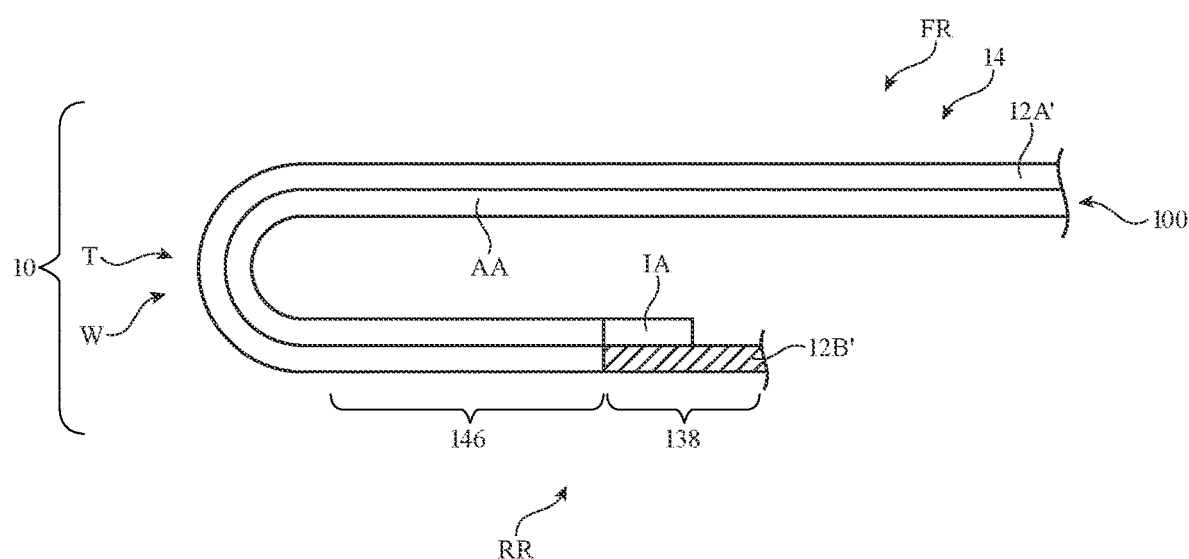
FIG. 17 is a cross-sectional side view of an illustrative electronic device without an image transport layer that has a bent flexible display layer with a first portion on a front face of the device and a second strip-shaped portion that runs along an edge of an opposing rear face of the device in accordance with an embodiment.

FIG. 17 is a cross-sectional side view of device 10 in an illustrative configuration in which image transport layer 80 has been omitted. Display layer 100 of FIG. 17 has been bent so that active area AA conforms to the curved inner surface of transparent housing portion 12A' on sidewall W and in rear face region 146 on rear face RR of device 10. Region 146 may have the shape of an elongated strip that runs along upper edge T of rear face RR of device 10. Active area AA in region 146 may be used to display notifications, message content, and/or other information for a user. Housing portion 12B' may overlap inactive area IA in region 138. Housing portion 12B' may be opaque in region 138 to help block inactive area IA from view.

Figure 18:
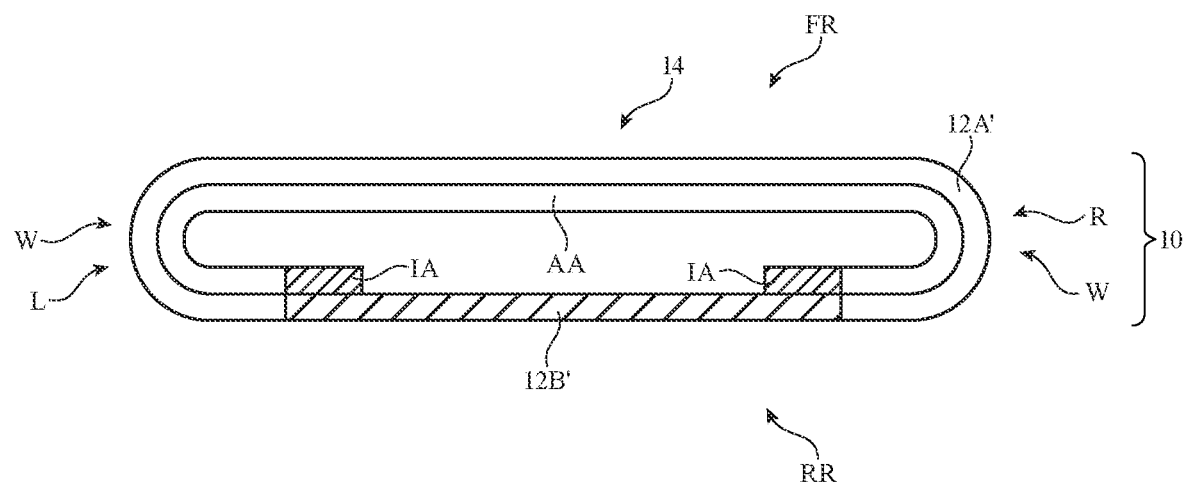
FIG. 18 is a cross-sectional side view of an illustrative electronic device without an image transport layer that has a flexible display layer with bent edge portions and inactive border regions hidden behind an opaque portion of a rear housing wall in accordance with an embodiment.

FIG. 18 is a cross-sectional side view of device 10 in an illustrative configuration in which image transport layer 80 has been omitted and in which display layer 100 has bent left and right edges. Along left edge L, display layer 100 may be bent about a bend axis that runs parallel to left edge L, so that active area AA wraps around the inner surface of the display cover layer formed by transparent housing portion 12'.

Along right edge R, display layer 100 may be bent around a bend axis that runs parallel to right edge R, so that active area AA wraps around the inner surface of the display cover layer formed by transparent housing portion 12'. Housing portion 12B' may be opaque and may overlap inactive area IA at the opposing left and right edges of layer 100. With this type of arrangement, some of active area AA is visible through transparent sidewalls W and portions of active area AA running along the left and right edges of device 10 may be visible on rear face RR. If desired, this type of arrangement may be used at upper edge T and lower edge B of device 10 (e.g., in an arrangement in which display layer 100 is unbent along its left and right edges).

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content.

Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
   central and peripheral pixels configured to display an image;
   an image transport layer having an input surface that receives the image and an output surface to which the received image is transported through the image transport layer, wherein the image transport layer comprises first and second sets of fibers; and
   a display cover layer comprising a planar central portion and a curved peripheral portion, wherein the central pixels emit image light that passes through the first set of fibers and exits the first set of fibers in a first direction, wherein the peripheral pixels emit image light that passes through the second set of fibers and exits the second set of fibers in a second direction not parallel to the first direction, and wherein the curved peripheral portion is configured to refract the image light exiting the second set of fibers toward the first direction.

2. The electronic device defined in claim 1 wherein each fiber of the first and second sets of fibers extends from the input surface to the output surface and wherein the curved peripheral portion has compound curvature.

3. The electronic device defined in claim 2 wherein each fiber of the first set of fibers extends vertically between the input surface and the output surface.

4. The electronic device defined in claim 1 wherein a portion of the output surface is curved and wherein the second set of fibers forms the curved portion of the output surface.

5. The electronic device defined in claim 1 wherein the first and second sets of fibers have a constant thickness.

6. The electronic device defined in claim 1 wherein the input surface and the output surface have a same shape.

7. The electronic device defined in claim 1 wherein the display cover layer comprises glass.

8. The electronic device defined in claim 7 further comprising:
a housing in which the central and peripheral pixels and the image transport layer are mounted, wherein the housing has a front and a rear, the display cover layer is at the front, and the housing comprises a glass portion at the rear.

9. The electronic device defined in claim 8 wherein the curved peripheral portion of the display cover layer is a first curved portion, and the glass portion at the rear of the housing has a second curved portion that is coupled to the first curved portion.

10. A cellular telephone, comprising:
a display having an array of pixels configured to display an image, wherein the display has a planar portion and a curved portion;
an image transport layer having an input surface that receives the image and an output surface to which the image is transported; and
a display cover layer that overlaps the image transport layer and that has a planar front surface, a sidewall surface, and a curved surface that connects the planar front surface to the sidewall surface, wherein the curved portion of the display faces the curved surface and the sidewall surface and wherein the image transport layer comprises a plurality of fibers between the planar portion of the display and the planar front surface, between the curved portion of the display and the curved surface, and between the curved portion of the display and the sidewall surface.

11. The cellular telephone defined in claim 10 wherein multiple fibers of the plurality of fibers form a continuous curved profile that overlaps the curved portion of the display.

12. The cellular telephone defined in claim 11 wherein the curved surface and the sidewall surface of the display cover layer overlap the continuous curved profile.

13. The cellular telephone defined in claim 12 wherein the curved surface of the display cover layer has compound curvature.

14. The cellular telephone defined in claim 13 wherein the curved portion of the display has a tail portion, and the tail portion is coupled to a printed circuit.

15. The cellular telephone defined in claim 13 wherein each fiber of the plurality of fibers extends from the input surface to the output surface.

16. A wearable electronic device, comprising:
a housing comprising a transparent layer with a curved portion;
a flexible display layer in the housing, wherein the flexible display layer comprises an active area that displays an image, and the flexible display layer has a curved portion that forms a part of the active area and a planar portion that forms a part of the active area; and
an image transport layer that overlaps the planar portion and the curved portion of the flexible display layer, wherein the image transport layer transports the image from an input surface to an output surface, wherein the output surface has a curved output surface portion, wherein the curved output surface portion overlaps the curved portion of the flexible display layer and is overlapped by the curved portion of the transparent layer, wherein the image transport layer comprises a plurality of fibers, and wherein multiple fibers of the plurality of fibers form the curved output surface portion.

17. The wearable electronic device defined in claim 16 wherein each fiber of the plurality of fibers extends vertically between the input surface and the output surface.

18. The wearable electronic device defined in claim 17 wherein first fibers of the plurality of fibers that form the curved output surface portion have greater heights than second fibers of the plurality of fibers that overlap the planar portion of the flexible display layer.

19. The wearable electronic device defined in claim 16 wherein the plurality of fibers each comprise a fiber core surrounded by cladding.

20. The wearable electronic device defined in claim 19 wherein the image transport layer comprises binder material between the plurality of fibers.

21. An electronic device, comprising:
a flexible display that displays an image and has edges including first and second opposing bent edges that are respectively bent about first and second bend axes and including third and fourth opposing unbent edges that are longer than the first and second bent edges;
an image transport layer that has an input surface and an opposing output surface, wherein the input surface receives the image and wherein the image is transported through the image transport layer to the output surface; and
a display cover layer, wherein the image transport layer is between the flexible display and the display cover layer and wherein the display cover layer has an inner surface region with a curved cross-sectional profile that overlaps the first and second bent edges.

22. The electronic device defined in claim 21 further comprising a printed circuit, wherein the flexible display has an active area with an array of pixels that is surrounded by an inactive area that is free of pixels, wherein the inactive area includes an inactive tail portion with signal paths that is bent about the second bend axis and that is electrically coupled to the printed circuit, and wherein the inactive area includes an inactive portion along the first edge that is bent about the first bend axis.

23. The electronic device defined in claim 22 wherein the input surface has a curved cross-sectional profile overlapping the first and second bent edges and wherein the output surface has a curved cross-sectional profile overlapping the first and second bent edges.

24. The electronic device defined in claim 23 wherein the image transport layer comprises a coherent fiber bundle having straight fibers that run parallel to each other between the input surface and the output surface.

25. The electronic device defined in claim 23 wherein the active area has a center portion that lies in a plane, wherein the display cover layer has a central planar portion that overlaps the center portion of the active area and that has a surface normal, and wherein the image transport layer comprise a coherent fiber bundle formed from straight fibers that all run parallel to the surface normal.

26. The electronic device defined in claim 25 further comprising cellular telephone transceiver circuitry.

27. The electronic device defined in claim 21 wherein the image transport layer comprises Anderson localization material.

28. An electronic device, comprising:
a housing having a transparent housing portion;
a flexible display layer having an array of pixels configured to display an image, having opposing first and second edges, and having opposing third and fourth edges, wherein the flexible display layer has a first portion along the first edge that is bent about a first bend axis, has a second portion along the second edge that is bent about a second bend axis that is parallel to the first bend axis, has a third portion along the third edge that is bent about a third bend axis and wherein the flexible display layer is unbent along the fourth edge; and
an image transport layer between the transparent housing portion and the flexible display layer, wherein the image transport layer has an input surface and an opposing output surface, wherein the input surface receives the image, wherein the image is transported through the image transport layer to the output surface, and wherein the input surface has a planar portion overlapping the unbent flexible display layer along the fourth edge.

29. The electronic device defined in claim 28 wherein the flexible display layer has an active area containing the array of pixels and an inactive area that is free of pixels, wherein the inactive area surrounds the active area, wherein the first and second portions include bent portions of the active area, and wherein there are no active area bends along the third edge.

30. The electronic device defined in claim 29 wherein the input surface has a curved cross-sectional profile overlapping the first and second portions.

31. The electronic device defined in claim 30 wherein the image transport layer has corner portions and wherein each corner portion has an input surface area with a curved developable surface and a corresponding output surface area of compound curvature.

32. The electronic device defined in claim 31 wherein the housing has an additional housing portion, wherein the unbent flexible display layer along the fourth edge has a planar inactive area portion that is interposed between the transparent housing portion and the additional housing portion.

33. The electronic device defined in claim 32 further comprising:
a first layer of adhesive between the planar inactive area portion and the transparent housing portion; and
a second layer of adhesive between the planar inactive area portion and the additional housing portion.

34. The electronic device defined in claim 28 wherein the image transport layer comprises a coherent fiber bundle having straight fibers that extend parallel to each other between the input surface and the output surface.

35. The electronic device defined in claim 28 wherein the image transport layer comprises a coherent fiber bundle, the electronic device further comprising cellular telephone transceiver circuitry.

36. An electronic device having opposing front and rear faces, comprising:
a housing having a first housing portion and a second housing portion, wherein the first housing portion forms a display cover layer that has a first display cover layer portion on the front face, a second display cover layer portion on the rear face, and a third display cover layer portion that extends between the first and second display cover layer portions, wherein the third display cover layer portion has a curved cross-sectional profile and forms a curved sidewall for the housing;
a flexible display layer having pixels configured to display an image, wherein the flexible display layer has a first portion facing the first display cover layer portion, a second portion facing the second display cover layer portion, and a third portion facing the third display cover layer portion; and
an image transport layer between the first portion of the flexible display layer and the first display cover layer portion, wherein the image transport layer extends across the flexible display layer.

37. The electronic device defined in claim 36 wherein the second housing portion is opaque and overlaps an area of the flexible display layer that is free of pixels.

38. The electronic device defined in claim 37 wherein the second housing portion forms a housing wall on the rear face.

39. The electronic device defined in claim 36 wherein the image transport layer has a coherent fiber bundle with straight fibers that run parallel to each other.

* * * * *